(12) United States Patent
Kim et al.

(10) Patent No.: US 10,465,290 B2
(45) Date of Patent: Nov. 5, 2019

(54) SUBSTRATE PROCESSING APPARATUS

(71) Applicant: Samsung Electronics Co., Ltd., Suwon-si, Gyeonggi-do (KR)

(72) Inventors: Minjong Kim, Hwaseong-si (KR); Seonggil Park, Suwon-si (KR); Jaebeom Park, Yongin-si (KR); Jung-soo Yoon, Hwaseong-si (KR); Keeyoung Jun, Seongnam-si (KR); Choongrae Cho, Hwaseong-si (KR); Jongwon Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 232 days.

(21) Appl. No.: 15/469,212

(22) Filed: Mar. 24, 2017

(65) Prior Publication Data

US 2018/0051375 A1    Feb. 22, 2018

(30) Foreign Application Priority Data

Aug. 19, 2016 (KR) .......................... 10-2016-0105430

(51) Int. Cl.
| | |
|---|---|
| *C23C 16/50* | (2006.01) |
| *C23C 16/04* | (2006.01) |
| *C23C 16/455* | (2006.01) |
| *C23C 16/458* | (2006.01) |
| *C23C 16/52* | (2006.01) |
| *H01J 37/32* | (2006.01) |

(52) U.S. Cl.
CPC .............. *C23C 16/50* (2013.01); *C23C 16/04* (2013.01); *C23C 16/4586* (2013.01); *C23C 16/45565* (2013.01); *C23C 16/52* (2013.01); *H01J 37/3244* (2013.01); *H01J 37/3255* (2013.01); *H01J 37/32366* (2013.01); *H01J 37/32715* (2013.01); *H01J 37/32724* (2013.01)

(58) Field of Classification Search
CPC .. C23C 16/4581; C23C 16/4404; C23C 14/50
See application file for complete search history.

(56) References Cited

U.S. PATENT DOCUMENTS

| | | |
|---|---|---|
| 5,881,208 A | 3/1999 | Geyling et al. |
| 6,403,925 B1 | 6/2002 | Johnsgard et al. |
| 7,540,923 B2 | 6/2009 | Takagi et al. |
| 7,999,210 B2 | 8/2011 | Kuibira et al. |
| 8,772,682 B2 | 7/2014 | Ambal et al. |
| 2003/0019584 A1* | 1/2003 | Choi ................ H01J 37/32431 156/345.51 |
| 2003/0019858 A1 | 1/2003 | Dornfest et al. |

(Continued)

FOREIGN PATENT DOCUMENTS

KR    10-2006-0059809 A    6/2006

*Primary Examiner* — Matthew J Song
(74) *Attorney, Agent, or Firm* — Myers Bigel, P.A.

(57) ABSTRACT

Disclosed is a substrate processing apparatus. The substrate processing apparatus comprises a process chamber providing an inner space where a substrate is treated, a support unit disposed in the inner space and supporting the substrate, and a gas supply unit providing the inner space with a process gas required for generating plasma. The support unit comprises a base having a top surface on which the substrate is placed, a heater disposed in the base, and a coating layer formed on the top surface of the base.

13 Claims, 6 Drawing Sheets

(56) References Cited

U.S. PATENT DOCUMENTS

| | | | | |
|---|---|---|---|---|
| 2008/0006204 A1* | 1/2008 | Rusinko | ............... | C23C 16/4581 |
| | | | | 118/715 |
| 2008/0029032 A1* | 2/2008 | Sun | ..................... | H01L 21/6833 |
| | | | | 118/728 |
| 2014/0034242 A1* | 2/2014 | Sant | .................. | H01J 37/32605 |
| | | | | 156/345.51 |
| 2015/0024155 A1* | 1/2015 | Sun | ................... | H01J 37/32477 |
| | | | | 428/34.6 |
| 2015/0376780 A1* | 12/2015 | Khaja | ................. | C23C 16/4405 |
| | | | | 134/1.1 |

* cited by examiner

SUBSTRATE PROCESSING APPARATUS

CROSS-REFERENCE TO RELATED APPLICATION

This U.S. nonprovisional patent application claims priority under 35 U.S.C § 119 of Korean Patent Application 10-2016-0105430 filed on Aug. 19, 2016, the entire contents of which are hereby incorporated herein by reference.

FIELD

The present inventive concept relates to a substrate processing apparatus and, more particularly, to a substrate processing apparatus that uses plasma to treat a substrate.

BACKGROUND

In general, the formation of thin films on wafers may be divided into physical vapor deposition (PVD) using physical technologies and chemical vapor deposition (CVD) using chemical technologies.

Chemical vapor deposition may use chemical reaction of source materials to form single crystalline semiconductor thin films or insulation layers on a surface of a wafer. The chemical vapor deposition may be broadly classified, according to the pressure of a chamber, into a low pressure chemical vapor deposition (LPCVD), an atmosphere pressure chemical vapor deposition (APCVD), a plasma enhanced chemical vapor deposition (PECVD), and a high pressure chemical vapor deposition (HPCVD).

SUMMARY

Embodiments of the present inventive concept provide a substrate processing apparatus capable of controlling deposition thickness.

According to exemplary embodiments of the present inventive concept, a substrate processing apparatus may comprise: a process chamber providing an inner space where a substrate is treated; a support unit disposed in the inner space and supporting the substrate; and a gas supply unit providing the inner space with a process gas required for generating plasma. The support unit may comprise: a base having a top surface on which the substrate is placed; a heater disposed in the base; and a coating layer formed on the top surface of the base.

According to exemplary embodiments of the present inventive concept, a substrate processing apparatus may comprise: a process chamber; and a support unit in the process chamber, the support unit including a heater therein and a top surface on which the substrate is placed. The support unit may comprise: a coating region where the coating layer is formed; and a non-coating region where the coating layer is not formed.

Details of other exemplary embodiments are included in the description and drawings.

DETAILED DESCRIPTION OF EMBODIMENTS

Figure 1:
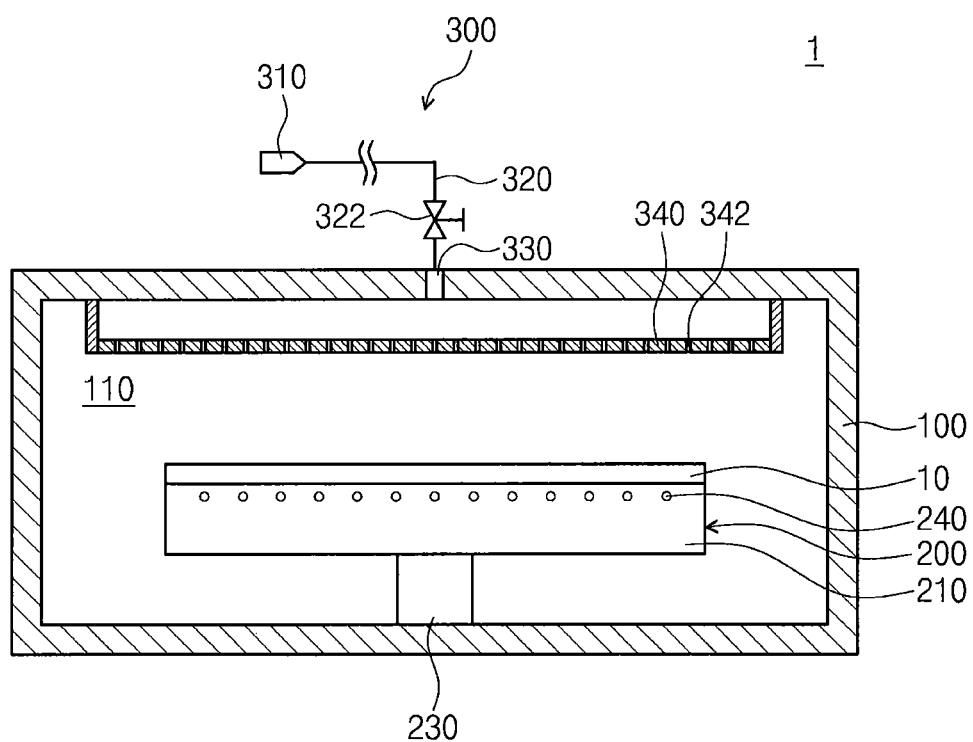
FIG. 1 shows a substrate processing apparatus according to exemplary embodiments of the present inventive concept.

FIG. 1 shows a substrate processing apparatus 1 according to exemplary embodiments of the present inventive concept. Referring to FIG. 1, the substrate processing apparatus 1 may include a process chamber 100, a support unit 200, and a gas supply unit 300. The substrate processing apparatus 1 may use plasma to treat a substrate 10. For example, the substrate processing apparatus 1 may use plasma to perform a deposition process on the substrate 10. However, technical features of the present inventive concept are not limited thereto but applicable to various kinds of processes using plasma to treat substrates.

The process chamber 100 may have therein an inner space 110 in which processes are performed. As not shown in figures, the process chamber 100 may be provided with an opening for loading/unloading the substrate 10 into/from the inner space 110 and exhaust holes for exhausting byproducts produced during processes and residual gas remaining in the process chamber 100, as would be understood by those skilled in the art.

The support unit 200 may be positioned in the inner space 110. The substrate 10 may be placed on the support unit 200. The support unit 200 may include a base 210, a coating layer 220, a supporter 230, and a heater 240. The substrate 10 may lie on a top surface of the base 210. The base 210 may be provided to have the same size as the substrate 10. The supporter 230 may put the base 210 in position. For example, the supporter 230 and the base 210 may be fixedly coupled to each other about a support axis (see I of FIG. 2). The support axis I may be a central axis of the base 210.

Figure 2:
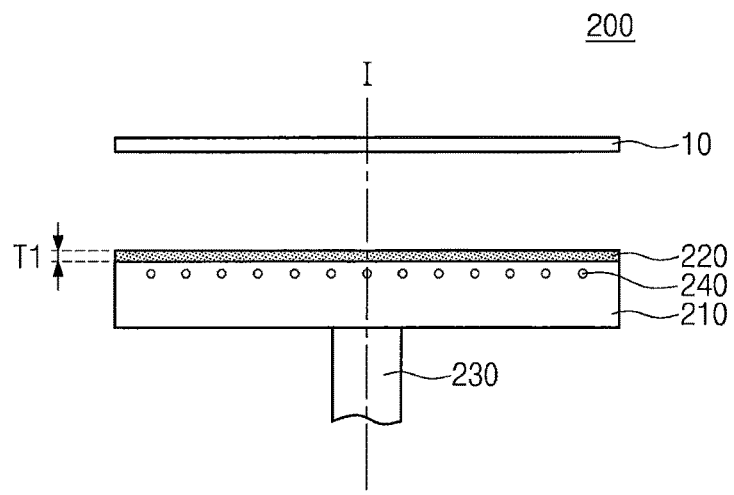
FIG. 2 is an enlarged view of a support unit shown in FIG. 1.
Figure 3:
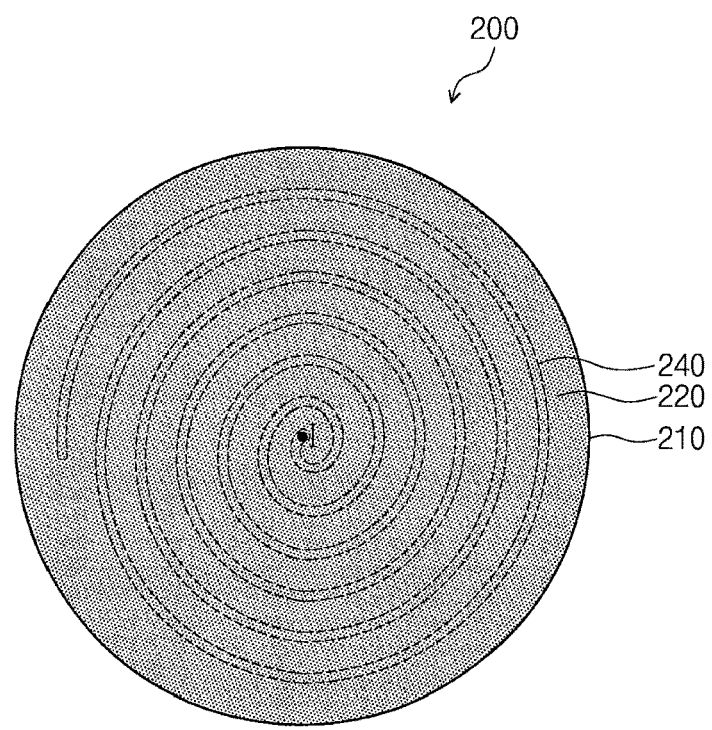
FIG. 3 is a plan view of a support unit shown in FIG. 2.

FIG. 2 is an enlarged view of the support unit 200 shown in FIG. 1. FIG. 3 is a plan view of the support unit 200 shown in FIG. 2. FIGS. 2 and 3 are exaggeratingly illustrated for simplicity of the descriptions, and thus dimensions of the drawings may be different from the actual ratio. Referring to FIGS. 2 and 3, the support unit 200 may include the coating layer 220. For example, the coating layer 220 may be formed on the top surface of the base 210. The coating layer 220 may be formed on the entire surface of the base 210. The coating layer 220 may include a material having a thermal conductivity value that is less than a thermal conductivity value of the base 210. It thus may be possible to reduce a heat transfer amount from the base 210 to the substrate 10 placed on the coating layer 220. For example, the base 210 may include AlN or Al, and the coating layer 220 may include $Y_2O_3$ or $ZrO_2$. For example, AlN may have a thermal conductivity of about 319 W/mK, Al may have a thermal conductivity of about 204 W/mK, $Y_2O_3$ may have a thermal conductivity of about 10 W/mK, and $ZrO_2$ may have a thermal conductivity of about 3 W/mK.

The coating layer 220 may be formed to have a first thickness T1. The first thickness T1 may be in the range from about 1 µm to about 10 µm. The first thickness T1 may be preferably about 5 µm. The base 210 may be provided with the heater 240. For example, the heater 240 may be provided within the base 210. The heater 240 may be a coil-shaped wound heating wire. The heater 240 may be radially or helically disposed within the base 210. The heater 240 may be disposed to have the same density per unit area within the base 210, but not limited thereto, or to have a different density in each portion of the base 210.

Figure 4:
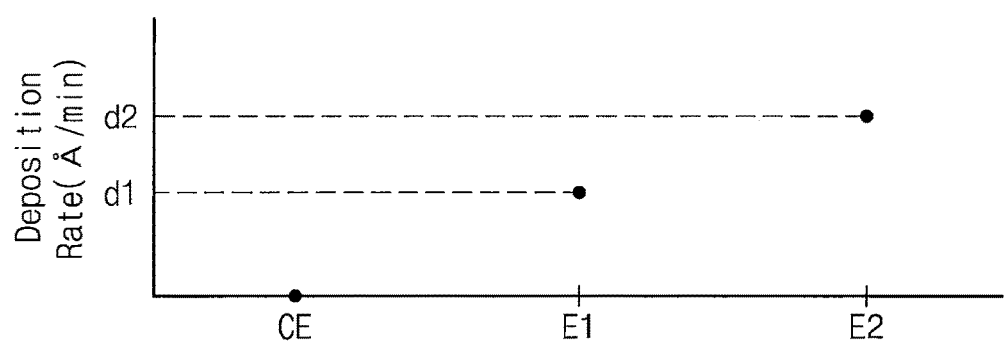
FIG. 4 is a graph showing deposition rates according to a comparative embodiment and exemplary embodiments of the present inventive concept.

FIG. 4 is a graph showing deposition rates according to a comparative embodiment and exemplary embodiments of the present inventive concept. In other words, FIG. 4 may exhibit a deposition rate in accordance with the presence and thickness of the coating layer 220. FIG. 4 may display deposition rates according to a comparative embodiment CE, a first embodiment E1, and a second embodiment E2. The comparative embodiment CE may show a deposition rate when the coating layer 220 is not formed, the first embodiment E1 may show a deposition rate when the coating layer 220 is deposited with a thickness T1 of 3 µm, and the second embodiment E2 may show a deposition rate when the coating layer 220 is deposited with a thickness T1 of 5 µm. A difference d1 of deposition rates between the comparative embodiment CE and the first embodiment E1 may be in the range from about 15 Å/min to about 25 Å/min, and a difference d2 of deposition rates between the comparative embodiment CE and the second embodiment E2 may be in the range from about 30 Å/min to about 40 Å/min. In more detail, the difference d1 of deposition rates between the comparative embodiment CE and the first embodiment E1 may be about 20 Å/min, and the difference d2 of deposition rates between the comparative embodiment CE and the second embodiment E2 may be about 35 Å/min. FIG. 4 demonstrates that the deposition rate may be affected by the presence and thickness of the coating layer 220, but the present inventive concept is not limited thereto. For example, a specific numerical value of the difference in the deposition rate may also be changed depending on process conditions such as a kind of process gas. Here it should be noted that the terms of "the first" and "the second" in the embodiments are conveniently named to distinguish different embodiments, but not used to limit the embodiments and to represent preferable embodiments.

Referring back to FIG. 1, the gas supply unit 300 may provide the inner space 110 with process gases. The gas supply unit 300 may include a gas reservoir 310, a gas supply line 320, a gas inflow port 330, and a shower head 340. The gas supply line 320 may connect the gas reservoir 310 to the gas inflow port 330. The gas supply line 320 may provide the gas inflow port 330 with a process gas stored in the gas reservoir 310. The gas supply line 320 may be provided thereon with a valve 322, which opens and closes a flow passage and adjusts an amount of gas flowing through the gas supply line 320. The shower head 340 may be positioned to face the support unit 200 and provided to have a diameter greater than that of the support unit 200. The shower head 340 may include therein holes 342 through which gas is injected. In some embodiments, the shower head 340 may be composed of silicon. Selectively, the shower head 340 may be composed of a metal material.

As not shown in figures, the process chamber 100 may further include therein a plasma generating unit that produces plasma from process gases, as would be understood by those skilled in the art. The plasma generating unit (not shown) may include a capacitive coupled plasma source or an induced coupled plasma source.

Figure 5:
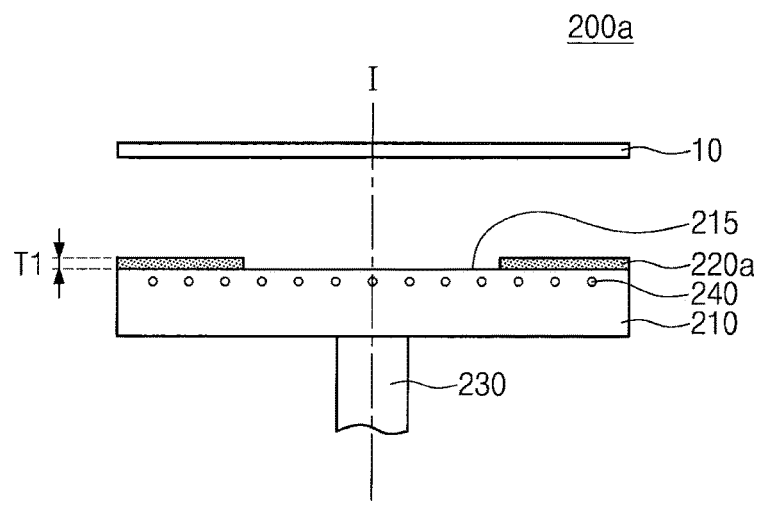
FIG. 5 is an enlarged view of a support unit according to exemplary embodiments of the present inventive concept.
Figure 6:
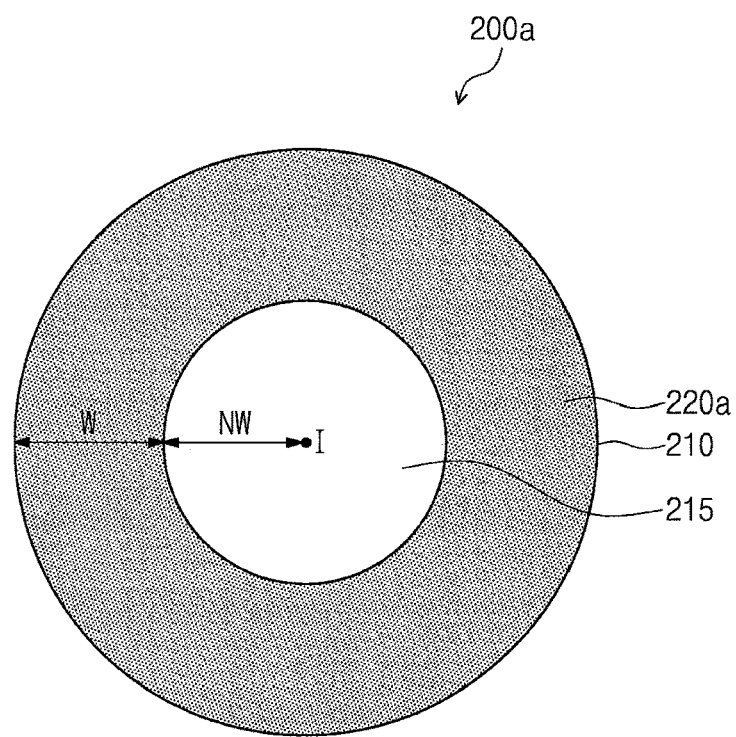
FIG. 6 is a plan view of a support unit shown in FIG. 5.

FIG. 5 is an enlarged view of a support unit 200a according to exemplary embodiments of the present inventive concept. FIG. 6 is a plan view of the support unit 200a shown in FIG. 5. FIGS. 5 and 6 are exaggeratingly illustrated for simplicity of the descriptions, and thus dimensions of the drawings may be different from the actual ratio. In the embodiment that follows, components substantially the same as those of the support unit 200 discussed with reference to FIGS. 2 and 3 are allocated the same reference numerals thereto, and a repetitive description may be omitted in the interest of brevity of the explanation. The support unit 200a may include the heater 240, likewise the support unit 200 discussed above, which is not illustrated for brevity of the drawing.

Referring to FIGS. 5 and 6, the support unit 200a may include a base 210 and a coating layer 220a. The coating layer 220a may be partially formed on the base 210. In other words, the support unit 200a may include a coating region 220a where a coating layer is formed and a non-coating region 215 where no coating layer is formed. For example, the coating region 220a may occupy an edge portion of the base 210 and the non-coating region 215 may occupy a central portion of the base 210, but positions and shapes of the regions 220a and 215 are not limited thereto. The coating region 220a and the non-coating region 215 are exemplarily illustrated to have the same widths W and NW, respectively, but the present inventive concept is not limited to the widths W and NW of the coating and non-coating regions 220a and 215.

The coating layer 220a may have a first thickness T1. The first thickness T1 may be in the range from about 1 µm to about 10 µm. The first thickness T1 may be preferably about 5 µm. As the coating region 220a has a thermal conductivity less than that of the non-coating region 215, a temperature difference may be less at a portion of the substrate 10 positioned on the coating region 220a than at other portion of the substrate 10 positioned on the non-coating region 215. Even if the coating region 220a is partially formed on a top surface of the support unit 200a, the very small thickness of the coating layer 220a may hardly have an effect on accuracy in loading/unloading of the substrate 10 and performing of processes.

Figure 7:
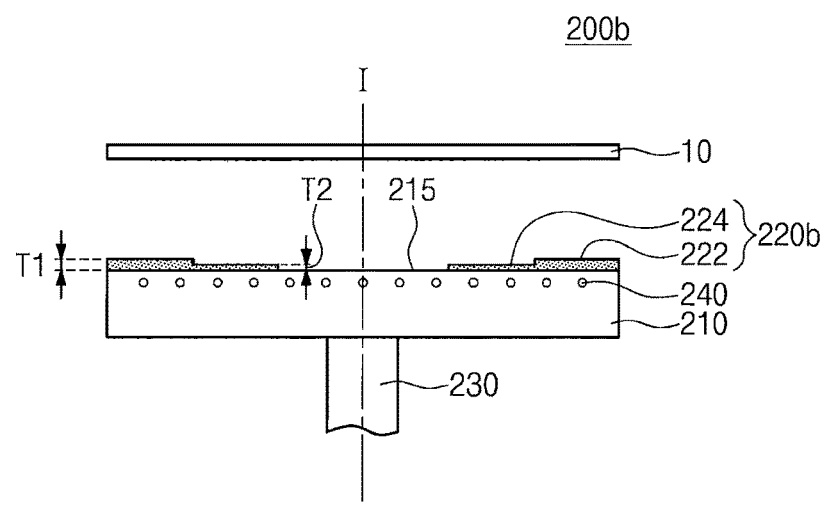
FIG. 7 is an enlarged view of a support unit according to exemplary embodiments of the present inventive concept.
Figure 8:
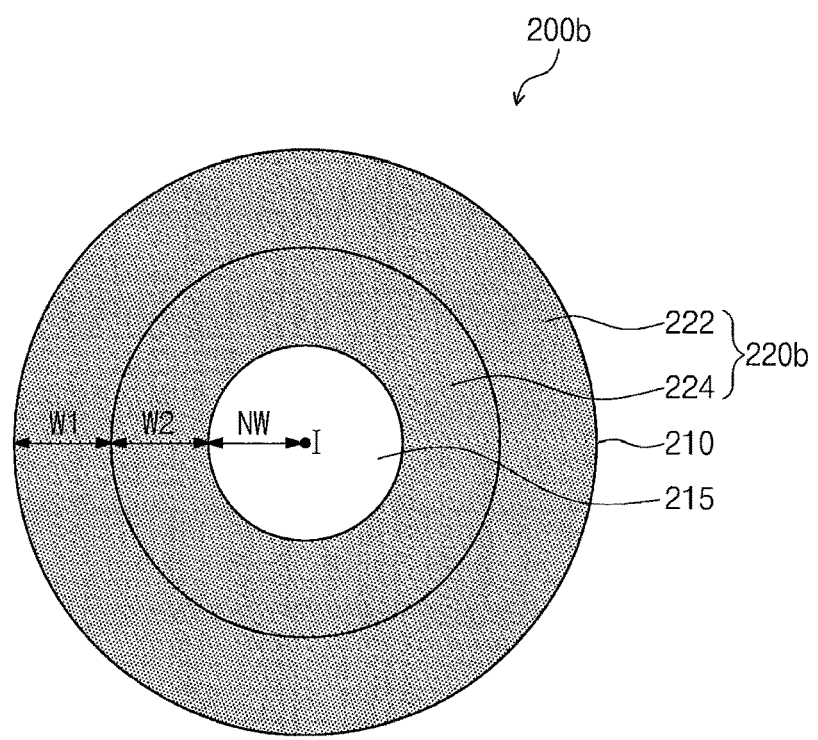
FIG. 8 is a plan view of a support unit shown in FIG. 7.

FIG. 7 is an enlarged view of a support unit 200b according to exemplary embodiments of the present inventive concept. FIG. 8 is a plan view of the support unit 200b shown in FIG. 7. FIGS. 7 and 8 are exaggeratingly illustrated for simplicity of the descriptions, and thus dimensions of the drawings may be different from the actual ratio. In the embodiment that follows, components substantially the same as those of the support unit 200a discussed with reference to FIGS. 5 and 6 are allocated the same reference numerals thereto, and a repetitive description may be omitted in the interest of brevity of the description. The support unit 200b may include the heater 240, likewise the support unit 200 discussed above, which is not illustrated for brevity of the drawing.

Referring to FIGS. 7 and 8, the support unit 200b may include a base 210, a coating region 220b whose thickness is irregular, and a non-coating region 215 where no coating layer is formed. The coating region 200b may include a first coating region 222 and a second coating region 224. For example, the first coating region 222 may occupy an edge portion of the base 210, the non-coating region 215 may occupy a central portion of the base 210, and the second coating region 224 may occupy an intermediate portion between the first coating region 222 and the non-coating region 215, but positions and shapes of the regions 222, 215 and 224 are not limited thereto. The first and second regions 222 and 224 and the non-coating region 215 are exemplarily illustrated to have the same widths W1, W2 and NW, respectively, but the present inventive concept is not limited to the widths W1, W2 and NW of the first and second coating regions 222 and 224 and the non-coating region 215.

The first coating region 222 may have a first thickness T1, and the second coating region 224 may have a second thickness T2 different from the first thickness T1. The second thickness T2 may be less than the first thickness T1. For example, the first thickness T1 may be in the range from about 4 µm to about 10 µm, and the second thickness T2 may be in the range from about 1 µm to about 4 µm. Preferably, the first thickness T1 may be about 5 µm and the second thickness T2 may be about 3 µm. As the first and second coating regions 222 and 224 have a thermal conductivity less than that of the non-coating region 215, a temperature difference may be less at portions of the substrate 10 positioned on the first and second coating regions 222 and 224 than at other portion of the substrate 10 positioned on the non-coating region 215. Also, since the first thickness T1 of the first coating region 222 is greater than the second thickness T2 of the second coating region 224, a temperature difference may be less at a portion of the substrate 10 positioned on the first coating region 222 than at other portion of the substrate 10 positioned on the second coating region 224. Even if the coating region 220b is partially formed on a top surface of the support unit 200b, the very small thickness of the coating region 220b may hardly have an effect on accuracy in loading/unloading of the substrate 10 and performing processes.

Figure 9:
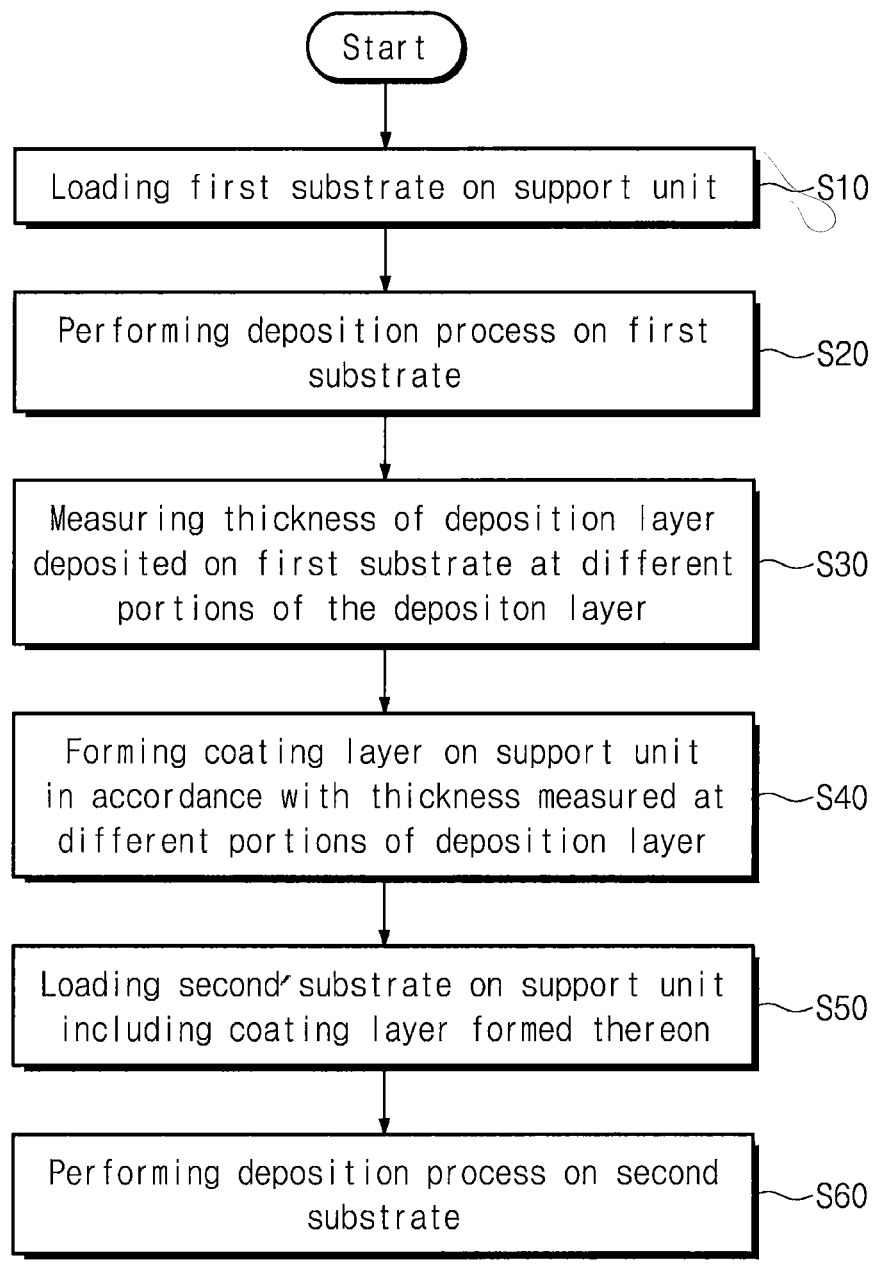
FIG. 9 is a flow chart for explaining a method of treating a substrate using the substrate processing apparatus of FIG. 1.

FIG. 9 is a flow chart for explaining a method of treating a substrate using the substrate processing apparatus 1 of FIG. 1. The substrate processing apparatus 1 may include one of the support units 200, 200a and 200b discussed above. For convenience of the description, it will be discussed about an example that the substrate processing apparatus 1 includes the support unit 200a of FIGS. 5 and 6.

A first substrate may be loaded on the support unit 200a in the process chamber 100 (S10). For example, the first substrate may be provided for testing purpose. A deposition process may be performed on the first substrate (S20). When the deposition process is terminated, a measurement may be carried out to measure a thickness of a deposition layer deposited on the first substrate (S30). The thickness of the deposition layer may be measured at its different portions on the first substrate. For example, an optical inspection apparatus may be employed to measure the thickness of the deposition layer, but the measurement method is not limited thereto. After measuring the thickness of the deposition layer on the first substrate, a coating layer 220a may be formed on the support unit 200a in accordance with the obtained thickness of the deposition layer measured at its different portions on the first substrate (S40). In other words, it may be determined whether or not to form the coating layer 220a on the support unit 200a based on feedback information about the obtained thickness of the deposition layer measured at its different portions on the first substrate. A mask may be used to selectively form the coating layer 220a on a portion of the support unit 200a. For example, when the measured thickness of the deposition layer is greater on an edge portion of the first substrate than on a central portion of the first substrate, as formerly mentioned, the coating layer 220a may be formed limitedly on an edge portion of the base 210. A second substrate may be loaded on the support unit 200a on which the coating layer 220a is formed (S50). A deposition process may be performed on the second substrate in the process chamber 100 (S60). Although FIG. 9 exemplarily shows the deposition process, as formerly mentioned, various plasma processes other than the deposition process may also be applicable.

As discussed above, in order to block or reduce thermal conductivity between the support unit and the substrate, the coating layer may be formed relatively thicker on a portion of the support unit where the measured thickness of the deposition layer is relatively greater than on other portion of the support unit where the measured thickness of the deposition layer is relatively smaller, as illustrated in FIG. 7. Alternatively, as illustrated in FIG. 5, the coating layer may be formed on a portion of the support unit where the measured thickness of the deposition layer is relatively greater, and no coating layer is formed on other portion of the support unit where the measured thickness of the deposition layer is relatively smaller. The coating layer may be selectively formed on the support unit by ascertaining the variation in thickness of the deposition layer formed on the substrate, and thus it may be possible to reduce the variation in thickness of a deposition layer which will be formed in a subsequent process.

Although it has been described about an example where the aforementioned substrate processing apparatus 1 is employed to form the coating layer of a single material, different kinds of materials may also be deposited on the support unit depending on process conditions, designs, recipes, or the like. The shapes of the coating regions 220a and 220b are exemplarily explained as one example, so that the coating regions may be formed to have various locations and sizes in accordance with the thickness of the deposition layer at its different portions on the substrate 10. For example, when the deposition layer formed on the substrate 10 has a thickness that is greater at its central portion and smaller at its edge portion, the coating layer may be formed on the central portion of the support unit but not formed on the edge portion of the support unit.

According to the present inventive concept, the coating layer may be selectively formed on the support unit such that the conductive conductivity toward the substrate may be controlled at different portions of the substrate.

In general, when the substrate is processed using plasma, a variation in temperature transmitted to the substrate placed on the support unit may occur. For example, the substrate may undergo the temperature variation caused by non-uniformity in process gas flow within the process chamber, dead zone locally formed within the process chamber, and/or variation in temperature at different portions of the support unit. The temperature variation occurred on the substrate may also affect the thickness of the deposition layer deposited on the substrate. In some embodiments, the temperature variation at different portions of the coating layer may be compensated by controlling the presence and/or thickness of the coating layer. As a result, a uniform thin film may be formed on the substrate.

According to the present inventive concept, the coating layer may be selectively formed on the support unit such that the conductivity toward the substrate may be controlled at different portions of the support unit.

The effects of the present inventive concept are not limited to the aforementioned effects. Other effects, which are not mentioned above, will be apparently understood by one skilled in the art from the foregoing description and accompanying drawings.

These embodiments herein are presented to facilitate understanding of the present inventive concept and should not limit the scope of the present inventive concept, and it is intended that the present inventive concept covers the various combinations, the modifications, and variations. The technical protection scope of the present inventive concept will be defined by the technical spirit of the appended claims, and is intended to include all modifications and equivalent substantially falling within the spirit and scope of the invention while not being limited by literary descriptions in the appended claims.

What is claimed is:

1. A substrate processing apparatus, comprising:
a process chamber;
a support unit disposed in the process chamber and configured to support a substrate; and
a gas supply unit configured to supply the process chamber with a process gas required for generating a plasma,
wherein the support unit comprises:
a base having a top surface on which the substrate is placed;
a heater disposed in the base; and
a coating layer formed on the top surface of the base,
wherein the top surface of the base comprises:
a coating region under the coating layer, the coating region having a first coating region and a second coating region disposed in the first coating region; and
a non-coating region disposed in the first and second coating region and exposed by the coating layer, wherein a radius of the non-coating region is same as a width of the first coating region and a width of the second coating region,
wherein the coating layer comprises:
a first coating layer disposed on the first coating region, the first coating layer having a first thickness; and
a second coating layer disposed on the second coating region, the second coating layer having a second thickness lower than the first thickness.

2. The substrate processing apparatus of claim 1, wherein the coating region occupies an edge portion of the base, and the non-coating region occupies a central portion of the base.

3. The substrate processing apparatus of claim 1, wherein the coating layer has a thickness ranging from about 1 μm to about 10 μm.

4. The substrate processing apparatus of claim 1, wherein the first coating region occupies an edge portion of the base, and the second coating region occupies a central portion of the base, the second coating region being positioned between the first coating region and the non-coating region.

5. The substrate processing apparatus of claim 1, wherein the first thickness is in a range from about 4 μm to about 10 μum, and the second thickness is in a range from about 1 μm to about 4 μm.

6. The substrate processing apparatus of claim 1, wherein the coating layer comprises $Y_2O_3$ or $ZrO_2$.

7. The substrate processing apparatus of claim 1, wherein the support unit comprises AlN or Al.

8. A substrate processing apparatus, comprising:
a process chamber; and
a support unit in the process chamber, the support unit comprising a heater therein and a top surface on which a substrate is placed,
wherein the top surface of the support unit comprises:
a coating region under a coating layer, the coating region having a first coating region and a second coating region disposed in the first coating region; and
a non-coating region disposed in the first and second coating region and exposed by the coating layer, wherein a radius of the non-coating region is same as a width of the first coating region and a width of the second coating region,
wherein the coating layer comprises:
a first coating layer disposed on the first coating region, the first coating layer having a first thickness; and
a second coating layer disposed on the second coating region, the second coating layer having a second thickness lower than the first thickness.

9. The substrate processing apparatus of claim 8, further comprising a gas supply unit that is disposed to face the support unit and that supplies the process chamber with a process gas.

10. The substrate processing apparatus of claim 8, wherein the coating layer comprises $Y_2O_3$ or $ZrO_2$, and the support unit comprises AlN or Al.

11. A substrate processing apparatus, comprising:
a process chamber;
a support unit in the process chamber that is configured to support a substrate, the support unit comprising:
a base having a top surface on which the substrate is placed;
a heater disposed in the base; and
a coating layer formed on a portion of the top surface of the base; and
a shower head positioned within the process chamber so as to face the support unit, the shower head configured to receive process gas from a gas reservoir, wherein the process gas is required for generating a plasma within the process chamber,
wherein a top surface of the base comprises:
a coating region under the coating layer, the coating region having a first coating region and a second coating region disposed in the first coating region; and
a non-coating region disposed in the first and second coating region and exposed by the coating layer, wherein a radius of the non-coating region is same as a width of the first coating region and a width of the second coating region,
wherein the coating layer comprises:
a first coating layer disposed on the first coating region, the first coating layer having a first thickness; and
a second coating layer disposed on the second coating region, the second coating layer having a second thickness lower than the first thickness.

12. The substrate processing apparatus of claim 11, wherein the coating region occupies an edge portion of the base, and the non-coating region occupies a central portion of the base.

13. The substrate processing apparatus of claim 11, wherein the shower head has a diameter that is greater than a diameter of the support unit.

* * * * *